(12) United States Patent
Goldberg

(10) Patent No.: US 7,380,226 B1
(45) Date of Patent: May 27, 2008

(54) SYSTEMS, METHODS, AND APPARATUS TO PERFORM LOGIC SYNTHESIS PRESERVING HIGH-LEVEL SPECIFICATION

(75) Inventor: Evgueni I. Goldberg, Berkeley, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 318 days.

(21) Appl. No.: 11/027,085

(22) Filed: Dec. 29, 2004

(51) Int. Cl.
*G06F 17/50* (2006.01)

(52) U.S. Cl. .............. 716/5; 716/1; 716/2; 716/4; 716/7; 716/10; 703/14; 703/19

(58) Field of Classification Search ............... 716/1–5, 716/10, 18; 703/14; 708/625, 628; 717/131
See application file for complete search history.

(56) References Cited

U.S. PATENT DOCUMENTS

| | | | |
|---|---|---|---|
| 5,530,664 A * | 6/1996 | Tsubata et al. ............ 708/625 |
| 5,586,046 A * | 12/1996 | Feldbaumer et al. .......... 716/18 |
| 5,703,802 A * | 12/1997 | Tsubata et al. ............ 708/628 |
| 5,790,416 A | 8/1998 | Norton et al. |
| 5,903,470 A * | 5/1999 | Miyoshi et al. ................ 716/2 |
| 5,937,190 A * | 8/1999 | Gregory et al. ............ 717/131 |
| 6,035,107 A * | 3/2000 | Kuehlmann et al. .......... 716/1 |
| 6,038,381 A * | 3/2000 | Munch et al. ................ 716/1 |
| 6,086,626 A * | 7/2000 | Jain et al. ...................... 716/5 |
| 6,301,687 B1* | 10/2001 | Jain et al. ...................... 716/3 |
| 6,397,170 B1* | 5/2002 | Dean et al. .................. 703/14 |
| 6,523,157 B1* | 2/2003 | Takahashi et al. ............ 716/10 |
| 6,571,378 B1* | 5/2003 | Blomgren et al. ............ 716/10 |
| 6,651,225 B1* | 11/2003 | Lin et al. ........................ 716/4 |
| 6,687,882 B1* | 2/2004 | McElvain et al. .............. 716/3 |
| 7,107,551 B1* | 9/2006 | de Dood et al. ................ 716/2 |
| 7,117,463 B2* | 10/2006 | Graham et al. ................. 716/5 |
| 7,127,686 B2* | 10/2006 | Drechsler et al. .............. 716/4 |
| 7,137,082 B1* | 11/2006 | Zohar .............................. 716/3 |
| 7,176,373 B1* | 2/2007 | Longo .......................... 84/626 |
| 2004/0025122 A1* | 2/2004 | Schubert et al. ................ 716/4 |
| 2005/0038616 A1* | 2/2005 | Sasaki ......................... 702/69 |
| 2006/0031795 A1* | 2/2006 | Rahmat et al. ................. 716/5 |
| 2006/0117274 A1* | 6/2006 | Tseng et al. .................... 716/1 |
| 2006/0120189 A1* | 6/2006 | Beerel et al. ................. 365/203 |

(Continued)

OTHER PUBLICATIONS

Jain et al.,, "Efficient symbolic simulation-based verification using the parametric form of Boolean expressions", Aug. 1994,☐☐Computer-Aided Design of Integrated Circuits and Systems, IEEE Transactions on, vol. 13, Issue 8, pp. 1005-1015.*

(Continued)

*Primary Examiner*—Stacy A Whitmore
*Assistant Examiner*—Helen Rossoshek
(74) *Attorney, Agent, or Firm*—Orion Law Group, Plc; William E. Alford; Teresa Wong (57) ABSTRACT

A method and an apparatus to perform logic synthesis preserving high-level specification and to check that a common specification (CS) of two circuits is correct have been disclosed. In one embodiment, the method includes building a circuit $N_2$ that preserves a predefined specification of a circuit $N_1$. In some embodiments, the method includes verifying that $N_2$ and $N_1$ indeed implement the same specification and so they are functionally equivalent.

27 Claims, 8 Drawing Sheets

U.S. PATENT DOCUMENTS

2006/0259880 A1* 11/2006 Dood et al. .................... 716/2

OTHER PUBLICATIONS

Goldberg et al., "Using SAT for combinational equivalence checking", Mar. 13-16, 2001, Design, Automation and Test in Europe, 2001. Conference and Exhibition 2001. Proceedings, pp. 114-121.*

Hulgaard et al., "Equivalence checking of combinational circuits using Boolean expression diagrams", Jul. 1999, Computer-Aided Design of Integrated Circuits and Systems, IEEE Transactions on, vol. 18, Issue 7, pp. 903-917.*

Zeng et al., "LPSAT: a unified approach to RTL satisfiability", Mar. 13-16, 2001, Design, Automation and Test in Europe, Conference and Exhibition 2001. Proceedings, pp. 398-402.*

Krishnamurthy et al.,, "Towards the complete elimination of gate/switch level simulations", 2004, VLSI Design, Proceedings. 17th International Conference on, pp. 115-121.*

Goldberg et al.; "Toggle Equivalence Preserving (TEP) Logic Optimization"; Aug. 29-31, 2007; Digital System Design Architectures, Methods and Tools, 2007. DSD 2007. 10th Euromicro Conference on; pp. 271-279.*

Sinha et al., "Implementation and Use of SPFDs in Optimizing Boolean Networks", Department of Electrical Engineering and Computer Sciences, University of California, Berkely, CA 94720, 1998, pp. 103-110.

Yamashita et al., "A New Method to Express Functional Permissibilites for LUT based FPGAs and Its Applications", NTT Communication Science Laboratories, 1996 IEEE, pp. 254-261.

Goldberg et al., "BerkMin: a Fast and Robust Sat-Solver", 8 pages.

Berman et al., "Functional Comparison of Logic Designs for VLSI Circuits", IBM T.J. Watson Research Center, 1989 IEEE, pp. 456-459.

Brand, "Verification of Large Synthesized Designs", IBM Research Division, 1993 IEEE, pp. 534-537.

Burch et al., "Tight Integration of Combinational Verification Methods", Cadence Berkeley Labs, 1998 ACM, pp. 570-576.

Goldberg, "Equivalence Checking of Dissimilar Circuits II", Cadence Berkeley Labs, Aug. 2004, 7 pages.

Goldberg, "Equivalence Checking of Dissimilar Circuits", Cadence Berkeley Labs, 8 pages.

Goldberg et al., "How Good Can a Resolution Based SAT-Solver Be?", Cadence Berkeley Labs, 15 pages.

Van Euk et al., "Exploiting Structural Similarities in a BDD-based Verification Method", Eindhoven University of Technology, 16 pages.

Kuehlmann et al., "Equivalence Checkign Using Cuts and Heaps", IBM Thomas J. Watson Research Center, 1997 ACM, pp. 263-268.

Matsunaga, "An Efficient Equivalence Checker for Combinational Circuits", Fujitsu Laboratories Ltd, 1996 ACM, pp. 629-634.

Goldberg et al., "On Complexity of Equivalence Checking", Cadence Berkeley Labs, Available on the Internet Sep. 2003, 9 pages.

Goldberg, "Logic Synthesis Preserving High-Level Specification", 13th IEEE/ACM International Workshop on Logic and Synthesis (IWLS 2004), Temecula, CA, Jun. 2004, 8 pages.

Goldberg et al., "BerkMin: A fast and Robust Sat-Solver", 2002 IEEE/ACM Design Automation and Test in Europe Conference and Exposition, Paris, France, Mar. 2002, 8 pages.

Goldberg et al., "Equivalence Checking of Dissimilar Circuits", 12th IEEE/ACM International Workshop on Logic and Synthesis (IWLS 2003), Laguna Beach, CA, May 2003, 8 pages.

Goldberg et al., "How Good Can a Resolution Based SAT-Solver Be?", Sixth International Conference on Theory and Applications of Satisfiability Testing (SAT 2003), Santa Margherita Ligure, Italy, May 2003, 8 pages.

Van Eijk et al., "Exploiting Structural Similarities in a BDD-based Verification Method", Eindhoven University of Technology, 1994, 16 pages.

* cited by examiner

SYSTEMS, METHODS, AND APPARATUS TO PERFORM LOGIC SYNTHESIS PRESERVING HIGH-LEVEL SPECIFICATION

FIELD OF INVENTION

The present invention relates to logic synthesis and verification, and more particularly, to performing logic synthesis preserving high-level specification and verifying that two circuits implement the same specification.

BACKGROUND

In electronic design automation processes, logic synthesis generally refers to the conversion of a high-level specification of a circuit design into a gate-level netlist, which typically describes the components to be used to implement the design and the connections between these components. One example of a high-level specification of the circuit design is a description of the functionality of the design in the register transfer level (RTL), such as description of how data is moved between registers and memory, how data is manipulated (e.g., by adding, by comparing, etc.), where data is stored (e.g., in some registers or memory locations), etc. In general, the RTL description may be written in a hardware description language (HDL). The HDL may handle several levels of abstraction, such as behavioral level, register transfer level, and gate levels. One example of the HDL is Verilog.

The netlist generated by logic synthesis may be written in various formats, such as in graphical format or in textual format, to represent the circuit that implements the high-level specification. Some conventional synthesis tools further optimize different portions of a design for a variety of attributes, such as area, speed, etc. For example, one conventional logic synthesis tool may optimize a portion of a design for area by using the smallest amount of area on a silicon chip while another conventional synthesis tool may optimize a portion of a design for speed by adding or removing some logic gates in the netlist. As a result, multiple netlists to achieve the same functionality described by the high-level specification may be generated for different kinds of optimization.

Furthermore, as new technologies in electronic device processing areb being developed to build smaller, faster, and better integrated circuits, netlists of alternative implementations may be generated by logic synthesis based on different fabrication processing technologies. These alternative implementations of the design may take advantage of some or all of these new technologies. The netlists may use different combinations of logic gates, electronic components, wire, etc. to achieve the same functionality as described in the high-level specification.

To ensure the accuracy of the logic synthesis performed, there is a need to verify that the different netlists indeed achieve the same functionality as specified. In other words, it is desired to have an efficient and accurate methodology to verify that a logic synthesis tool indeed preserves the high-level specification in an alternative implementation of the design.

Currently, a sequential circuit is a network of combinational sub-circuits implementing some next-state functions. If a combinational sub-circuit is large enough, it usually can be further partitioned into smaller sub-circuits. It was shown in *Equivalence checking of dissimilar circuits*. E. Goldberg, Y. Novikov, International Workshop on Logic and Synthesis, May 28-30, 2003, USA that the knowledge of a high-level structure of a circuit is crucial for efficient Equivalence Checking (EC). Namely, it was shown that if two combinational circuits $N_1, N_2$ have a Common Specification (CS), then there exists an efficient procedure for checking their equivalence.

Figure 1:
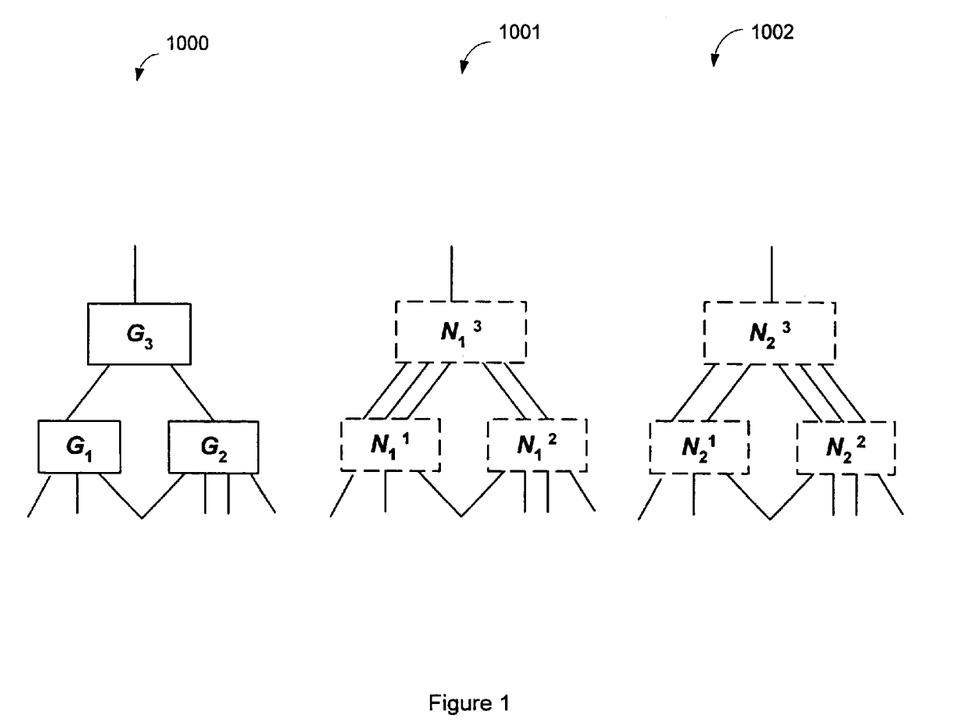
FIG. 1 illustrates embodiments of circuits having an exemplary common specification of three blocks.

A common specification S of $N_1$ and $N_2$ is typically defined as a circuit of multi-valued gates (which may also be referred to as blocks) such that $N_1$ and $N_2$ are different implementations of S. An example of a CS is given in FIG. 1. Circuits $N_1$ 1001 and $N_2$ 1002 have a 3-block CS 1000 shown on the left. Sub-circuits $N_1^i, N_2^i$ (where i=1, 2, or 3) are different implementations of the multi-valued block, $G_i$ of S. Circuit $N_m^i$ (m=1, 2) implements a multi-output Boolean function whose truth table is obtained from that of $G_i$ by replacing values of multi-valued variables with their binary codes. So the difference between $N_1^i$ and $N_2^i$ is in the choice of binary encodings for the variables of S.

In general, equivalence checking of circuits $N_1, N_2$ with a common specification S is typically infeasible if the common specification S is unknown. However, if the common specification S is known, then there may exist an efficient procedure for performing the equivalence checking of circuits $N_1, N_2$. This equivalence checking procedure can be used to design a new class of logic synthesis procedures. In general, a logic synthesis procedure has to verify that the original circuit $N_1$ and a changed circuit $N_2$ are functionally equivalent, i.e., to verify the change made from circuits $N_1$ to $N_2$. The more powerful this verification procedure is, the richer set of synthesis transformations can be used. So any progress in equivalence checking entails introducing a new class of synthesis transformations.

SUMMARY

The present invention includes a method and an apparatus to perform logic synthesis preserving high-level specification and to check that a common specification (CS) of two circuits is correct. In one embodiment, the method includes building a circuit $N_2$ that preserves a predefined specification of a circuit $N_1$, and then verifying that $N_2$ and $N_1$ indeed implement the same specification and so they are functionally equivalent. However, the logic synthesis procedure preserving high-level specification and the verification procedure checking if two circuits have the same CS can be used separately.

In some embodiments, building the circuit $N_2$ comprises deriving a plurality of sub-circuits, each of which is toggle equivalent to the corresponding sub-circuit of the circuit $N_1$. In another embodiment, verifying that $N_1$ and $N_2$ have the same specification and hence are functionally equivalent comprises computing in topological order correlation functions relating the outputs of corresponding sub-circuits of $N_1$ and $N_2$.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like reference indicate similar elements and in which.

DETAILED DESCRIPTION

A method and an apparatus to perform logic synthesis preserving high-level specification and to verify that two circuits implement the same high-level specification are described. In the following description, numerous specific details are set forth. However, it is understood that embodiments of the invention may be practiced without these specific details. In other instances, well-known components, structures, and techniques have not been shown in detail in order not to obscure the understanding of this description.

Reference in the patent description to "one embodiment" or "an embodiment" means that a particular feature, structure, or characteristic described in connection with the embodiment is included in at least one embodiment of the invention. The appearances of the phrase "in one embodiment" in various places in the patent description do not necessarily all refer to the same embodiment.

Figure 2:
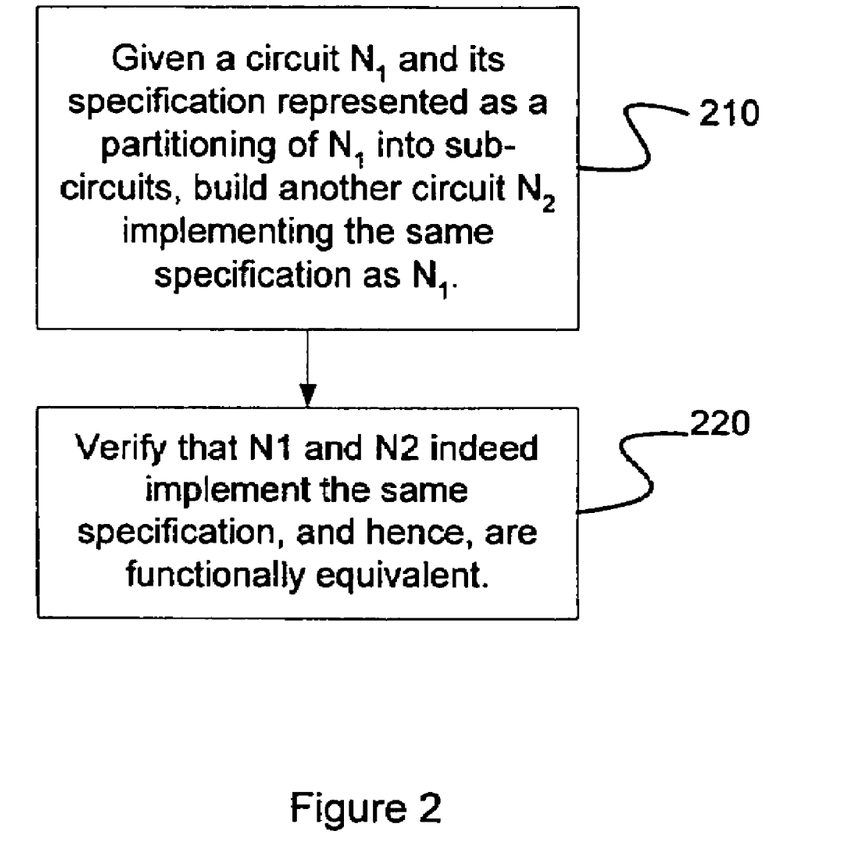
FIG. 2 illustrates a flow diagram of one embodiment of a process to perform logic synthesis.

FIG. 2 shows a flow diagram of one embodiment of a process to perform logic synthesis and to check that the synthesized and initial circuits implement the same specification. The process is performed by processing logic that may comprise hardware (e.g., circuitry, dedicated logic, etc.), software (such as an EDA tool, operable to run on a general-purpose computer system or a dedicated machine), or a combination of both.

Initially, processing logic builds a circuit $N_2$ implementing the same specification as initial circuit $N_1$ (processing block 210). The specification of circuit $N_1$ is represented as a partitioning of circuit $N_1$ into sub-circuits. Then processing logic verifies that circuits $N_1$ and $N_2$ indeed implement the same specification, and hence, circuits $N_1$ and $N_2$ are functionally equivalent (processing block 220). Details of each of the processing blocks 210 and 220 are further discussed below with reference to FIGS. 5 and 6.

However, before going into the details of each of the processing blocks 210 and 220, an overview of the concept of Toggle Equivalence and the relation between toggle equivalence and the notion of CS is now discussed.

Toggle Equivalence of Boolean Functions

In this section, the notion of toggle equivalence is introduced. Toggle equivalent Boolean functions can be considered as different implementations of the same multi-valued function.

Toggle Equivalence of Functions with Identical Sets of Variables

Let $f_1: \{0,1\}^n \to \{0,1\}^m$ and $f_2: \{0,1\}^n \to \{0,1\}^k$ be m-output and k-output Boolean functions of the same set of variables.

Functions $f_1$ and $f_2$ are toggle equivalent if $f_1(x) \neq f_1(x') <=> f_2(x) \neq f_2(x')$. Circuits $N_1$ and $N_2$ implementing the toggle equivalent functions $f_1$ and $f_2$ are called toggle equivalent circuits. This is hereinafter referred to as Definition 1. In other words, the functions $f_1$ and $f_2$ are toggle equivalent if for any pair of input vectors x, x' for which at least one output of $f_1$ changes (toggles), the same is true for $f_2$, and vice versa.

Let f be a multi-output Boolean function of n variables. The partition of the set $\{0,1\}^n$ (denoted by Part(f)) consists of the disjoint subsets $B_1, \ldots, B_k$, such that $f(x)=f(x')$ if and only if x, x' are in the same subset $B_i$. This is hereinafter referred to as Definition 2.

If $f_1$ and $f_2$ are toggle equivalent, there cannot be a pair of vectors x, x' such that x, x' are in the same subset of one partition and in different subsets of the other partition. Since $f_1$ and $f_2$ are toggle equivalent it is generally impossible that one function produces two identical output assignments while the other function toggles. Consequently, if two Boolean functions $f_1$ and $f_2$ are toggle equivalent, then Part($f_1$)=Part($f_2$). (The equality of partitions means that for each element $B_i$ of the partition Part($f_1$), there is an element $B'_j$ of the partition Part($f_2$) such that $B_i=B'_j$ and vice versa). Similarly, if Part($f_1$)=Part($f_2$), the $f_1$, $f_2$ are toggle equivalent. This proposition is hereinafter referred to as Proposition 1.

Let $f_1$ and $f_2$ be toggle equivalent single output Boolean functions. From Proposition 1, it follows that Part($f_1$)=Part($f_2$). Since $f_1$, $f_2$ are single output Boolean functions, Part($f_1$) and Part($f_2$) each includes two elements. So $f_1=f_2$ or $f_1=\sim f_2$, where "$\sim$" means negation. This is hereinafter referred to as Proposition 2.

A multi-output Boolean function f is called an implementation of a multi-valued function F if the truth table of f can be obtained from that of F in the following two steps: (1) Replace the values of multi-valued variables of F with their codes (we assume that different values of a variable are assigned different codes); and (2) fill in the empty rows (if any) of the truth table with arbitrary Boolean vectors. There if hereinafter referred to as Definition 3.

Suppose $f_1$ and $f_2$ are toggle equivalent. According to Proposition 1, Part($f_1$)=Part($f_2$). Furthermore, suppose Part($f_1$), Part($f_2$) each includes k elements. Then $f_1$ and $f_2$ are implementations of the function F: $\{0,1\}^n \to \{1, \ldots, k\}$, where F(x)=m, if and only if x is in the m-th element of the partition Part($f_1$). From Definition 3, it follows that $f_1$ and $f_2$ are two different implementations of the same multi-valued function of Boolean variables. This in hereinafter referred to as Proposition 3.

Proposition 3 is of great importance because it shows how one can reencode multi-valued variables implicitly. Suppose, a multi-output circuit $N_1$ implements a multi-valued function F whose output is described by a multi-valued variable Y. Suppose one needs to reencode the values Y to get a better implementation of F. Proposition 3 shows that by synthesizing a circuit $N_2$ that is toggle equivalent to $N_1$, one can obtain a new implementation of F. That is the values of the variable Y are reencoded implicitly without even knowing the binary encodings used to encode the values of Y to obtain $N_1$ and $N_2$ from F.

Toggle Equivalence of Functions with Different Sets of Variables

In this subsection, the notion of toggle equivalence is extended to the case of Boolean functions with different sets of variables that are related by constraint functions.

Let X and Y be two disjoint sets of Boolean variables, where the number of variables in X and Y may be different.

A Boolean function is denoted by Cf(X,Y} if this function satisfies the following two conditions: (1) There are no three vectors x, x', y (where x, x' are assignments to variables X and y is an assignment to variables Y) such that x≠x' and Cf(x, y)=Cf(x', y)=1; and (2) there are no three vectors x, y, y' such that y≠y' and Cf(x, y)=Cf(x, y')=1. This is hereinafter referred to as Definition 4. The function Cf may be referred to as a correlation function.

A correlation function specifies a mapping between two different encodings of the same multi-valued variable. Suppose V={$x_1$, ..., $x_p$} is the set of all assignments to the variable of X such that Cf($x_i$, y)=1 for some y. Let W={$y_1$, ..., $y_m$} be the set of all assignments to variable of Y such that Cf(x, $y_i$)=1 for some x. From the above definition of the correlation function, it follows that |W|=|V| (and so m=p) and there exists a natural bijective mapping between V and W that relates a vector $x_i$ of V and the vector $y_j$ of W for which Cf($x_i$, $y_j$)=1. The vectors $x_i$ and $y_i$ can be considered as the codes of the same value of a p-valued variable. This is hereinafter referred to as Remark 1.

Furthermore, let Cf(X,Y) be a Boolean function and X,Y be two sets of Boolean variables. Checking if Cf is a correlation function may include two satisfiability checks. First, checking the condition (1) in the definition of Cf may include testing the satisfiability of the expression, Cf(X,Y)^Cf(X',Y')^Neq(X,X')^Eq(Y,Y'). Here, Cf(X',Y') is a copy of Cf(X,Y), where variables of X',Y' are independent of those of X,Y. Neq(x, x') is equal to 1 if and only if x≠x'. The function Eq(Y,Y') is the negation of Neq(Y,Y'). Second, checking the condition (2) in the definition of Cf may include testing the satisfiability of Cf(X,Y)^Cf(X',Y')^Eq(X, X')^Neq(Y,Y'). If both expressions are constant 0, then Cf is a correlation function. This is hereinafter referred to as Remark 2.

Let $f_1:\{0,1\}^n \rightarrow \{0,1\}^m$ and $f_2:\{0,1\}^p \rightarrow \{0,1\}^k$ be m-output and k-output Boolean functions and X, Y specify their sets of Boolean variables, where |X|=n and |Y|=p. Further suppose that $D_{imp}$(X,Y) is a Boolean function. The functions $f_1$ and $f_2$ are called toggle equivalent under the constraint function $D_{imp}$(X,Y) if ($f_1$(x)≠$f_1$(x')^($D_{imp}$(x,y)=$D_{imp}$(x', y')=1))=>($f_2$(y)≠$f_2$(y'), and vice versa, i.e., ($f_2$(y)≠$f_2$(y')^($D_{imp}$(x,y)=$D_{imp}$(x', y')=1))=>$f_1$(x)≠$f_1$(x'). This definition is hereinafter referred to as Definition 5.

Let X,Y be two sets of Boolean variables and {$X_1$, ..., $X_s$} and {$Y_1$, ..., $Y_s$} be the partitions of X and Y, respectively. Let Cf($X_1$, $Y_1$), ..., Cf($X_s$, $Y_s$) be correlation functions. Suppose $f_1$(X) and $f_2$(Y) are toggle equivalent under the constraint function $D_{imp}$(X,Y)=Cf($X_1$, $Y_1$)^ ... ^Cf($X_s$,$Y_s$). As discussed above (see Proposition 3), the two toggle equivalent functions, $f_1$ and $f_2$, are two different implementations of the same multi-valued function of Boolean variables. Furthermore, taking into account of Remark 1 above, it follows that $f_1$ and $f_2$ are implementations of the same multi-valued function of s multi-valued variables. This proposition is hereinafter referred to as Proposition 4.

Testing Toggle Equivalence

Suppose N is a Boolean circuit. The set denoted by v(N) consists of the Boolean variables each of which is associated with either the output of a gate or a primary input of N. The Boolean function denoted by Sat(v(N)) satisfies the condition that Sat(z)=1 if and only if the assignment z to the variables v(N) is possible, i.e., consistent. For example, if circuit N consists of just one AND gate described by y=$x_1$^$x_2$, then v(N)={y, $x_1$, $x_2$} and Sat(v(N))= (~$x_1$∨~$x_2$∨y)^($x_1$∨~y)^($x_2$∨~y). This is hereinafter referred to as Definition 6.

Furthermore, suppose f is a Boolean function. The function f* is obtained from f by existentially quantifying away the variable x if f*=f( ..., x=0, ... )∨f( ..., x=1, ... ). This is hereinafter referred to as Definition 7.

Let $N_1$ and $N_2$ be Boolean circuits whose inputs are specified by sets of variables X and Y respectivley. Let $D_{imp}$(X,Y) be a constraint Boolean function that is also a correlation function. A Boolean function is denoted by $D_{out}$($N_1$,$N_2$) if it is obtained from the function H, where H=Sat(v($N_1$))^Sat(v($N_2$))^$D_{imp}$(X,Y), by existentaily quantifying away all the variables of H but the output variables of $N_1$ and $N_2$. This is hereinafter referred to as Definition 8.

Let $N_1$ and $N_2$ be circuits that are toggle equivalent under a constraint Boolean function $D_{imp}$(X,Y) that is also a correlation function. Let $D_{out}$($N_1$, $N_2$) be the function obtained from H=Sat(v($N_1$))^Sat(v($N_2$))^$D_{imp}$(X,Y) as described in Definition 8 above. Then $D_{out}$($N_1$,$N_2$) satisfies either condition of Definition 4 and hence it is a correlation function. For example, there cannot exist Boolean vectors z, z' and h (where z≠z' and z, z' are output assignments of $N_1$ and h is an output assignment of $N_2$) such that $D_{out}$(z,h) =$D_{out}$(z',h)=1. Indeed, it would mean that there exist pairs of vectors x, y and x', y' such that a) z=$N_1$(x), z'=$N_2$(x') and h=$N_2$(y)=$N_2$(y');b) $D_{imp}$(x, y)=1 and $D_{imp}$(x',y')=1; c) x≠x' and y≠y'; d) $N_1$(x)≠$N_1$(x') while $N_2$(y)=$N_2$(y'). But this is impossible since $N_1$ and $N_2$ are toggle equivalent. In the same way, it can be shown that if one replaces the assumption that $N_1$ and $N_2$ are toggle equivalent with the assumption that $D_{out}$ is a correlation function, then $N_1$ and $N_2$ can be proven to be toggle equivalent. In other words, circuits $N_1$, $N_2$ whose inputs are constrained by a correlation function $D_{out}$($N_1$, $N_2$) are toggle equivalent if and only if the function $D_{out}$($N_1$, $N_2$) is a correlation function. This is hereinafter referred to as Proposition 5.

Common Specification and Toggle Equivalence

The existence of a CS for the combinational circuits $N_1$ and $N_2$ implies that $N_1$, $N_2$ can be partitioned into toggle equivalent sub-circuits that are coupled in $N_1$ and $N_2$ in the same way. Although the technique described in the current document is illustrated with a specification of a circuit N that is represented as a partition, one should appreciate that the technique may also be applied to specifications that are represented as coverings. The difference between a partition and a covering is that in the case of a partition, a logic gate may be included in only one of the sub-circuits, whereas in the case of a covering, a logic gate may be shared by more than one sub-circuit. For example, suppose that a specification Spec(N) of a circuit N is given by the sub-circuits $N_1$, ..., $N_k$ and Spec(N) satisfies the following properties: (1) each gate of N is in at least one sub-circuit $N_i$; and (2) two different sub-circuits $N_i$, $N_j$ may share only internal gates (see Definition 10 below), then Spec(N) here is represented as a covering.

Let N=(V,E) be a Directed Acyclic Graph (DAG) representing a Boolean circuit, where V, E are sets of nodes and edges of N respectively. A subgraph N*=(V*,E*) of N is called a sub-circuit if the following two conditions are met: (a) If $g_1,g_2$ are in V* and there is a path from $g_1$ and $g_2$ in N, then all the nodes of N on that path are in V*; and (b) if $g_1,g_2$ of V* are coupled by an edge in N, then they are also coupled by an edge in N*. This definition is hereinafter referred to as Definition 9.

Let N* be a sub-circuit of N. An input of a gate g of N* is called an input of N* if it is not coupled to the output of some other gate of N*. A gate g of N* is called an internal gate if all the gates of N whose inputs are fed by the output of g are in N*. Otherwise, g is called an external gate. The output of an external gate is called an output of circuit N*. This definition is hereinafter referred to as Definition 10.

Let a Boolean circuit N be partitioned into k sub-circuits $N^1, \ldots, N^k$. Let T be a directed graph of k nodes such that nodes $G_i$ and $G_j$ of T are connected by a directed edge (from $n_i$ to $n_j$) if and only if an output of $N^i$ is connected to an input of $N^k$ in N. T is called the communication specification corresponding to the partition $N^1, \ldots, N^k$. The partition $N^1, \ldots, N^k$ is called topological if T is a DAG (i.e., if T does not contain cycles). This definition is hereinafter referred to as Definition 11.

Let T be the communication specification of the circuit N with respect to the topological partition $N^1, \ldots, N^k$. Let $G_i$ be the node of T corresponding to the sub-circuit $N^i$. The length of the longest path from an input of T to $G_i$ is called the level of $G_i$ and $N^i$ (denoted by level($G_i$) and level($N^i$) respectively). This definition is hereinafter referred to as Definition 12.

Figure 3:
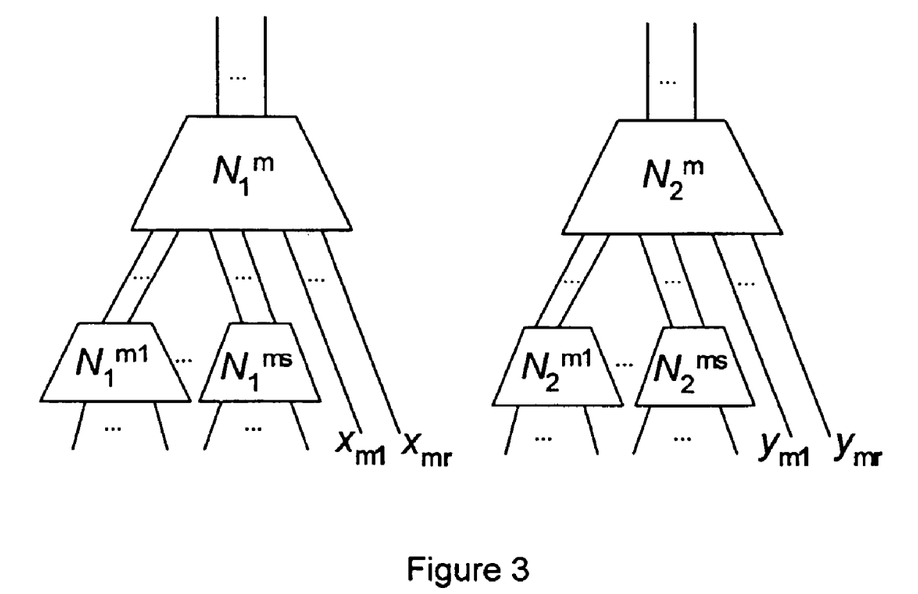
FIG. 3 illustrates Definition 13.

Let $N_1^1, \ldots, N_1^k$ and $N_2^1, \ldots, N_2^k$ be the topological partitions of two single output Boolean circuits $N_1$, $N_2$, respectively. Let the communication specifications of $N_1$ and $N_2$ with respect to the partitions $N_1^1, \ldots, N_1^k$ and $N_2^1, \ldots, N_2^k$ be identical. $D_{out}(N_1^m, N_2^m)$, where $m=1, \ldots, k$, are functions computed by induction in topological levels. This definition is hereinafter referred to as Definition 13. Namely, the functions $D_{out}$ for the sub-circuits on level 1 are first computed, then for those on level 2 are computed, and so on. The function $D_{out}(N_1^m, N_2^m)$ may be obtained from the function $H=Sat(v(N_1^m))\char`^Sat(v(N_2^m))\char`^D_{inpu}(N_1^m, N_2^m)$ by existentially quantifying away all the variables except the output variables of $N_1^m$, $N_2^m$. The function $D_{inp}(N_1^m, N_2^m)$ may be equal to $D_{out}(N_1^{i1}, N_1^{i1})\char`^ \ldots \char`^D_{out}(N_1^{is}, N_2^{is})\char`^Eq(x_{i1}, y_{i1})\char`^ \ldots \char`^Eq(x_{ir}, y_{ir})$. Note that $N_1^{i1}, \ldots, N_1^{is}, \ldots, N_2^{i1}, \ldots, N_2^{is}$ are the s sub-circuits (if any) whose outputs are coupled to the inputs of $N_1^m$, $N_2^m$, respectively. (FIG. 3 shows circuits $N_1^m$, $N_2^m$ and the subcircuits and primary inputs connected to inputs of $N_1^m$, $N_2^m$.) Variables $x_{i1}, \ldots, x_{ir}, y_{i1}, \ldots, y_{ir}$ are the r primary input variables of $N_1$ and $N_2$ (if any) that feed $N_1^m$ and $N_2^m$, respectively. The function, $Eq(x_{it}, y_{it})$, where $1 \leq t \leq r$, is equal to 1 if and only if $x_{it}$ is equal to $y_{it}$.

Let $N_1$, $N_2$ be two functionally equivalent single output circuits. Let T be a DAG of k nodes. Circuits $N_1$ and $N_2$ are implementations of a specification S (represented as a partitioning of $N_1$ and $N_2$) whose topology is given by T if and only if there is a partitioning, $Spec(N_1)=\{N_1^1, \ldots, N_1^k\}$ of $N_1$ and a partitioning $Spec(N_2)=\{N_2^1, \ldots, N_2^k\}$ of $N_2$ into k sub-circuits such that (1) the communication specifications $T_1$, $T_2$ of $N_1$ and $N_2$ with respect to the partitionings, $Spec(N_1)$, $Spec(N_2)$ are equal to T; and (2) each pair of the sub-circuits $N_1^m$, $N_2^m$ is toggle equivalent under the constraint function $D_{inp}(N_1^m, N_2^m)$ specified above. This proposition is hereinafter referred to as Proposition 6.

Proposition 6 may be proven by induction (in levels) using Propositions 4 and 5. Furthermore, the "only if" part may be proven by induction using the fact that two Boolean functions implementing the same multi-valued function are toggle equivalent.

Figure 4A:
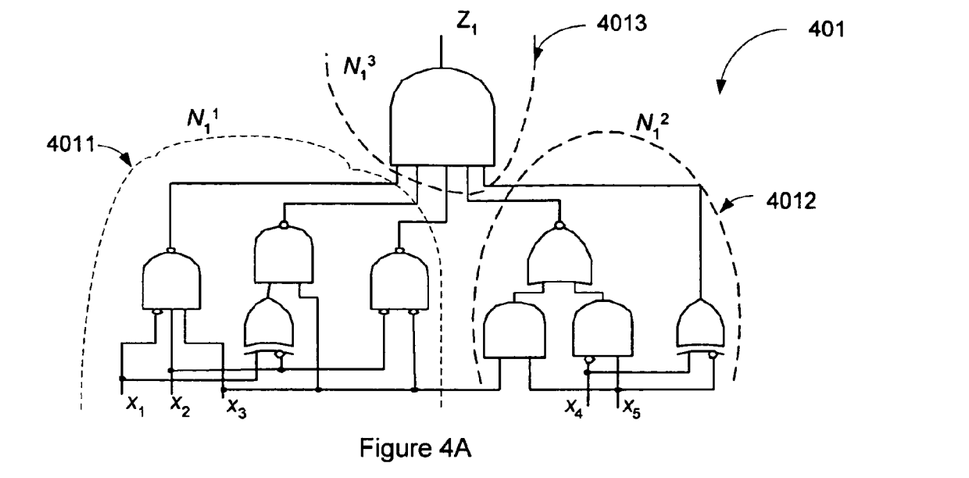
FIGS. 4A and 4B illustrate an example of two circuits partitioned into toggle equivalent sub-circuits.
Figure 4B:
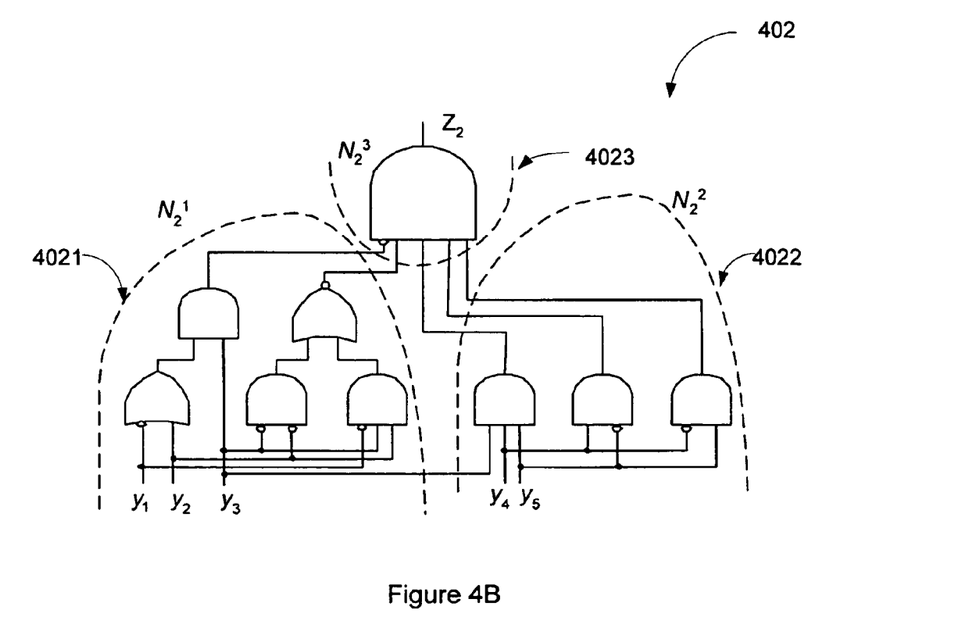

An example of circuits with a CS of three blocks is shown in FIGS. 4A and 4B. Circuit $N_1$ 401 (at the top) and $N_2$ 402 (at the bottom) have the same communication specification 1000 (shown in FIG. 1 on the left side). Sub-circuits $N_1^1$, $N_1^2$ (outlined by the dotted lines 4011 and 4012, respectively) are toggle equivalent to sub-circuits $N_2^1$, $N_2^2$ (outlined by the dotted lines 4021 and 4022, respectively) respectively in terms of their inputs related by the constraint functions $D_{inp(N1)}(N_1^1, N_2^1)=Eq(x_1, y_1)\char`^Eq(x_2, y_2)\char`^Eq(x_3, y_3)$ and $D_{inp}(N_1^2, N_2^2)=Eq(x_3, y_3)\char`^Eq(x_4, y_4)\char`^Eq(x_5, y_5)$ respectively. Sub-circuits $N_1^3$ and $N_2^3$ (outlined by the dotted lines 4013 and 4023, respectively) are toggle equivalent in terms of their local inputs related by the constraint function $D_{inp}(N_1^3, N_2^3)=D_{out}(N_1^1, N_2^1)\char`^D_{out}(N_1^2, N_2^2)$. The functions $D_{out}(N_1^1, N_2^1)$, $D_{out}(N_1^2, N_2^2)$ are obtained as described in Definition 13. In other words, when the same set of inputs is provided to both circuits $N_1$ 401 and $N_2$ 402, their corresponding outputs $Z_1$ and $Z_2$ are the same.

With the concept of toggle equivalence and common specification in mind, some embodiments of a process to verify a common specification of two circuits and some embodiments of a process to build a circuit to preserve a predefined specification of another circuit are described below.

Common Specification Verification

Figure 5:
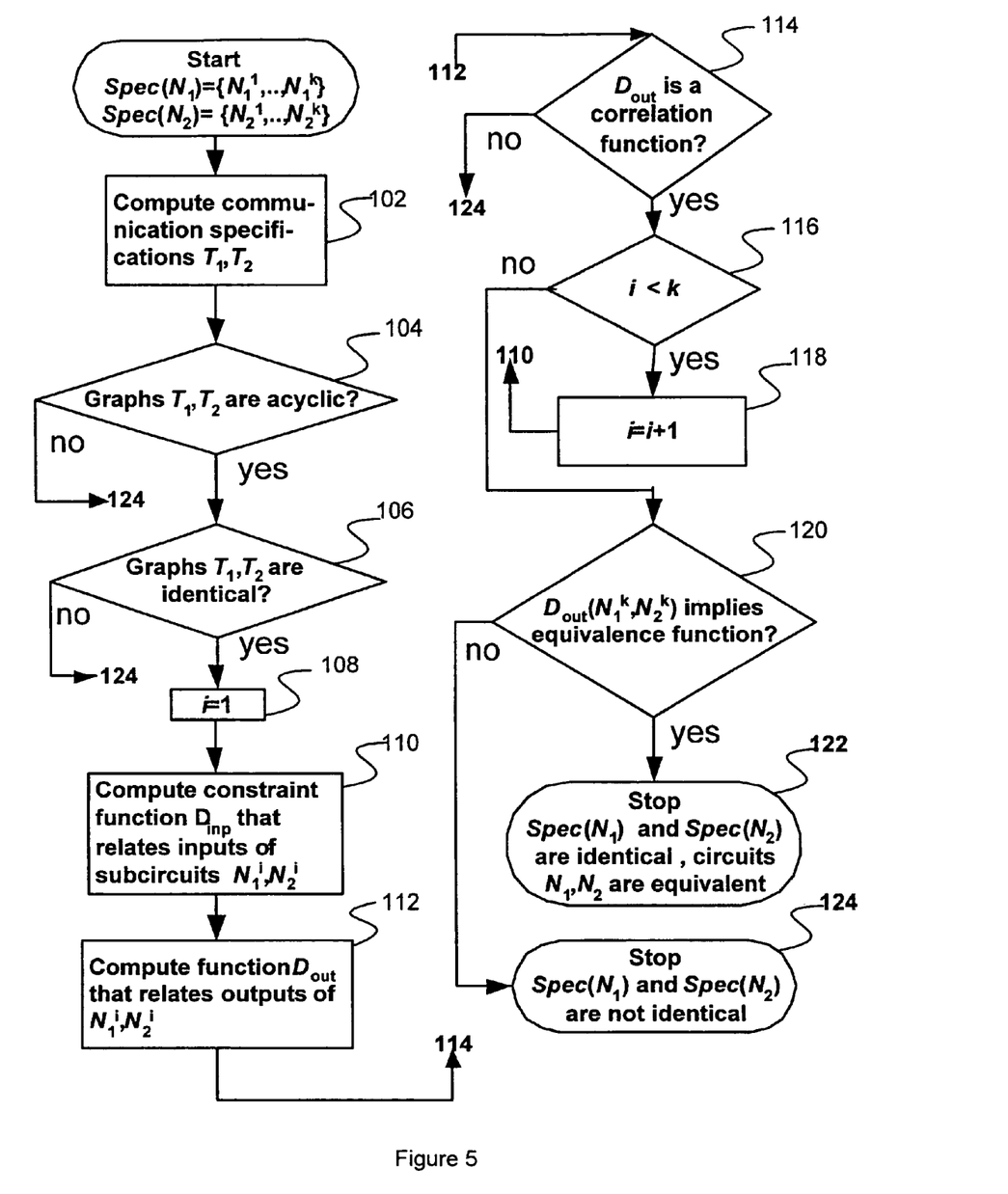
FIG. 5 illustrates a flow diagram of one embodiment of a process to verify a common specification of two given circuits.

FIG. 5 shows a flow diagram of one embodiment of a process to verify a common specification of two given circuits, $N_1$ and $N_2$. Note that specifications of $N_1$ and $N_2$ have the same number of sub-circuits. The process is performed by processing logic that may comprise hardware (e.g., circuitry, dedicated logic, etc.), software (such as a logic synthesis tool, operable to run on a general-purpose computer system or a dedicated machine), or a combination of both.

In one embodiment, the process starts with topological partitions, $Spec(N_1)$ and $Spec(N_2)$, of the two circuits, $N_1$ and $N_2$, respectively. Alternatively, the process may start with the coverings of $N_1$ and $N_2$. Processing logic computes communication specifications, $T_1$ and $T_2$, for $N_1$ and $N_2$, respectively (processing block 102). Then processing logic checks if $T_1$ and $T_2$ are acyclic (processing block 104). If $T_1$ and $T_2$ are cyclic, processing logic transitions to processing block 124 to end the process. Otherwise, processing logic checks if $T_1$ and $T_2$ are identical (processing block 106). If $T_1$ and $T_2$ are not identical, then processing logic transitions to processing block 124 to end the process. Otherwise, processing logic enters into a loop to go through each sub-circuit of $Spec(N_1)$ and $Spec(N_2)$. Note that $Spec(N_1)$ and $Spec(N_2)$ have the same number of sub-circuits. The sub-circuits of $Spec(N_1)$ and $Spec(N_2)$ are assumed to be numbered in topological order. That is, for any two sub-circuits $N_1^i$, $N_1^j$ of $Spec(N_1)$, if $i<j$, then level($N_1^i$)$\leq$level ($N_1^j$). And for any two sub-circuits $N_2^i$, $N_2^j$ of $Spec(N_2)$, if $i<j$, then level($N_2^i$)$\leq$level($N_2^j$).

In one embodiment, processing logic initiates the loop by setting an index, i, to 1, where i corresponds to the pair of sub-circuits $N_1^i$ and $N_2^i$ being analyzed in circuits $N_1$ and $N_2$ (processing block 108). Then processing logic computes a constraint function $D_{inp}$ that relates the inputs of the sub-circuits $N_1^i$ and $N_2^i$ (processing block 110). Processing logic further computes a function, $D_{out}$ that relates the outputs of the sub-circuits $N_1^i$ and $N_2^i$ (processing block 112). Then processing logic checks if $D_{out}$ is a correlation function (processing block 114). If $D_{out}$ is not a correlation function, and hence, $N_1^i$ and $N_2^i$ are not toggle equivalent, processing logic transitions to processing block 124 to end the process. Otherwise, processing logic checks whether the index, i, is less then k, where k is the total number of sub-circuits in $Spec(N_1)$ and $Spec(N_2)$ (processing block 116). If i is less than k, then processing logic increments i by one (processing block 118) and then repeats processing block 110.

If i is not less than k, then the loop has been completed and processing logic checks whether $D_{out}(N_1^k, N_2^k)$ implies equivalence function (processing block 120). If not, processing logic transitions to processing block 124 to end the process and concludes that $Spec(N_1)$ and $Spec(N_2)$ are not identical. On the other hand, if $D_{out}(N_1^k, N_2^k)$ implies equivalence function, then processing logic has successfully verified that $Spec(N_1)$ and $Spec(N_2)$ are identical and $N_1$ and $N_2$ are equivalent and the process ends (processing block 122).

The technique described above efficiently checks for equivalence of $N_1$ and $N_2$. As shown above, $N_1$ and $N_2$ share the same common specification (specified as a partitioning) if and only if $N_1$ and $N_2$ can be partitioned into sub-circuits that are connected in the same way and are toggle equivalent. The above technique allows logic synthesis to verify that different netlists generated indeed preserve a predetermined high-level specification. As described above, this is important for logic synthesis because logic synthesis may generate multiple different netlists in a variety of situations, such as in optimization for speed, optimization for area, switching from one fabrication process to another fabrication process, etc.

Let $N_1$, $N_2$ be two functionally equivalent circuits with a CS S represented by the partitions $Spec(N_1)=\{N_1^1, \ldots, N_1^k\}$, and $Spec(N_2)=\{N_2^1, \ldots, N_2^k\}$. The granularity of S is the size (i.e., the number of gates) of the largest sub-circuit $N_1^j$, i=1,2, j=1, \ldots, k. This is hereinafter referred to as Definition 14.

In some embodiments, the CS verification procedure is exponential in the granularity p of S and linear in the number of blocks of S, i.e., in the number of sub-circuits in Spec $(N_1)$, $Spec(N_2)$. (The exponentiality in p is due to existential quantification and the procedure to perform the correlation function.) If the value of p is fixed, the CS verification procedure proves the equivalence of specifications represented by $Spec(N_1)$ and $Spec(N_2)$ (and hence functional equivalence of $N_1$ and $N_2$) in linear time in the circuit size.

Comparison of Equivalence Checking Based on Specification Verification with Existing Equivalence Checkers Note that the efficiency of the CS verification procedure is due to the fact that a CS specification of $N_1$ and $N_2$ (represented by $Spec(N_1)$ and $Spec(N_2)$) is known. On the other hand, one can view state-of-the art equivalence checkers as procedures looking for a CS of $N_1$ of $N_2$ of a special kind. Such procedures try to find pairs of functionally equivalent points of $N_1$, $N_2$ and use them as cutpoints. Then these procedures look for new points of $N_1$, $N_2$ that are functionally equivalent in terms of cutpoints. The reason for looking for cutpoints is that checking functional equivalence of internal points of $N_1$, $N_2$ in terms of cutpoints is much easier than in terms of primary inputs. In general, this approach has the following two problems. The first problem is to find the new potential cutpoints (i.e., to find points of $N_1$, $N_2$ that are functionally equivalent). The second problem is to decide whether two functionally equivalent internal points can be used as cutpoints. Making a wrong decision here leads to the appearance of the so-called false negatives.

One can view the cut advancement approach employed by modern equivalence checkers as a search for a CS of $N_1$, $N_2$ of a special type, where very sub-circuit of $Spec(N_1)$ and $Spec(N_2)$ has exactly one output. However, if one tries to extend this approach to CSs of the general type (where sub-circuits of $Spec(N_1)$ and $Spec(N_2)$ may have many outputs), the two problems mentioned above may become virtually unsolvable. In the case of multi-output sub-circuits, functional equivalence is replaced with toggle equivalence. Suppose the granularity p of a CS of $N_1$, $N_2$ is 10. So the sub-circuits of $Spec(N_1)$ and $Spec(N_2)$ to be considered may have up to 10 outputs. Then the number of candidate sub-circuits in $N_1$ and $N_2$ is proportional to $|N_1|^{10}$ and $|N_2|^{10}$, respectively, where $|N_j|$ is the size of $N_j$ (j=1 or 2). The number of potential pairs of sub-circuits of $N_1$, $N_2$ to examine is proportional to $|N_1|^{10}*|N_2|^{10}$. But even if a pair of sub-circuits $N_1^i$, $N_2^i$ of size less or equal to 10 that are toggle equivalent has been found, one still has to decide if the outputs of $N_1^i$, $N_2^i$ can be used as cutpoints. That is, one has to decide whether $N_1^i$, $N_2^i$ are toggle equivalent "by chance" or $N_1^i$, $N_2^i$ are a part of a CS. Since the number of candidates is typically huge, the process is prone to mistakes.

Since finding a CS of $N_1$, $N_2$ in the case $Spec(N_1)$ and $Spec(N_2)$ contain multi-output sub-circuits is infeasible, in the equivalence checking procedure described in the current document, a CS of $N_1$, $N_2$ is required to be known. This makes this procedure efficient.

Specification Preservation

Figure 6:
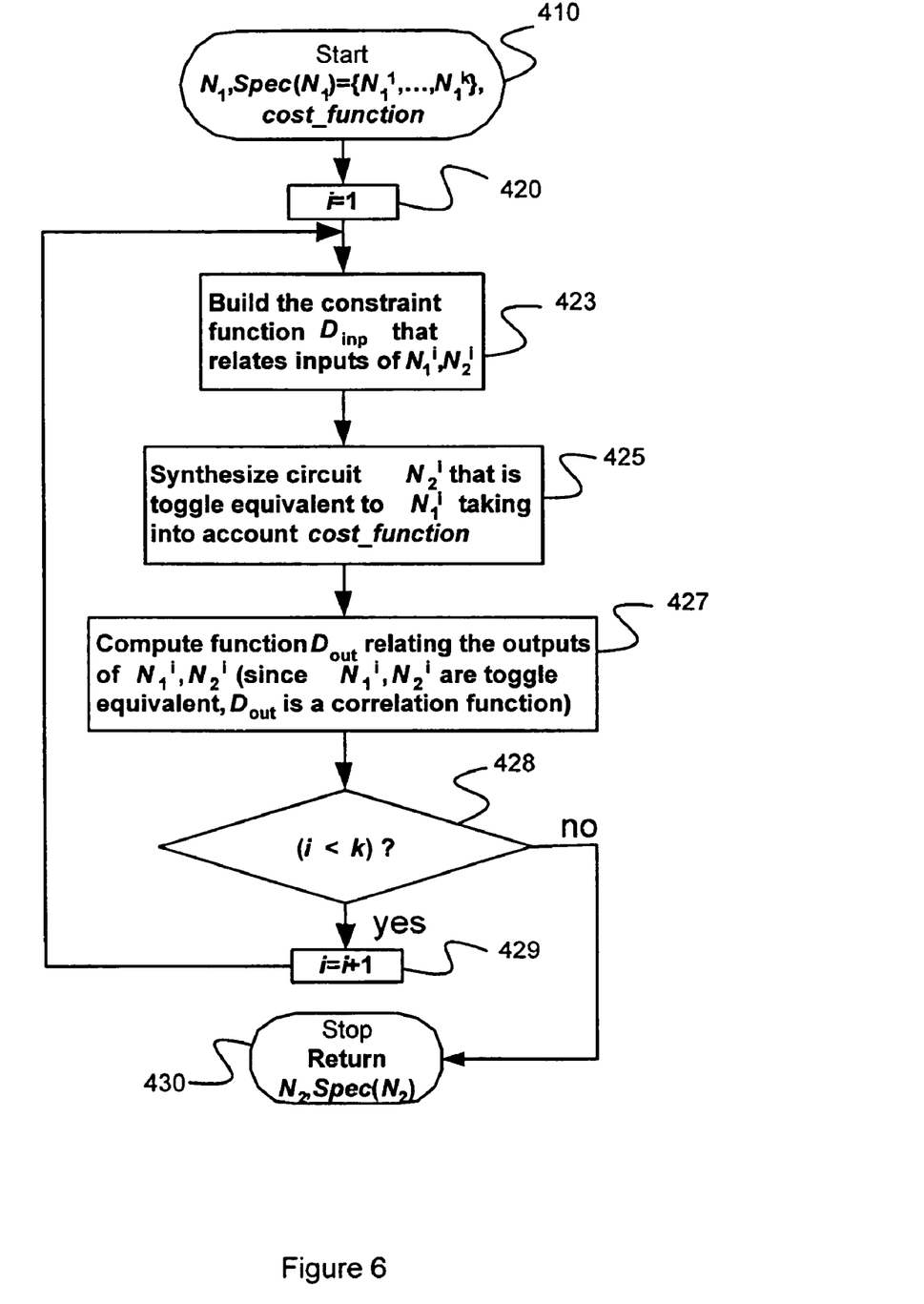
FIG. 6 illustrates a flow diagram of one embodiment of a process to build a circuit preserving a predefined specification of a given circuit.

FIG. 6 illustrates a flow diagram of one embodiment of a process to build a second circuit to preserve a predefined specification of a first circuit. The process may also be referred to as specification preservation (SP). The process is performed by processing logic that may comprise hardware (e.g., circuitry, dedicated logic, etc.), software (such as a logic synthesis tool, operable to run on a general-purpose computer system or a dedicated machine), or a combination of both.

In one embodiment, processing logic starts the process with the first circuit, $N_1$, the topological partition of $N_1$, $(Spec(N_1)=\{N_1^1, \ldots, N_1^k\})$, and the cost function to optimize during synthesis (processing block 410). $Spec(N_1)$ has k sub-circuits and processing logic goes through each sub-circuit in a loop. To initiate the loop, processing logic may set an index, i, to be one, where i corresponds to the sub-circuit of $Spec(N_1)$ being analyzed (processing block 420). The sub-circuits of $Spec(N_1)$ are assumed to be numbered in topological order. That is, for any two sub-circuits $N_1^i$, $N_1^j$ of $Spec(N_1)$, if i<j, then level($N_1^i$)≦level $(N_1^j)$.

In each iteration of the loop, processing logic performs several operations to build a portion of the second circuit, $N_2$. In one embodiment, processing logic builds a constraint function $D_{inp}$ that relates the inputs of $N_1^i$ and $N_2^i$ (processing block 423). Then processing logic may synthesize $N_2^i$, which is toggle equivalent to $N_1^i$, taking into account of the cost function (processing block 425). Processing logic may further compute a function, $D_{out}$ that relates the outputs of $N^{1i}$ and $N_2^i$ based on $D_{inp}$ (processing block 427). $D_{out}$ is a correlation function because $N_1^i$ nad $N_2^i$ are toggle equivalent. Then processing logic may check whether i is greater than k, where k is the total number of sub-circuits in $Spec(N_1)$ (processing block 428). If i is less than k, then processing logic may increment i by one (processing block 429) and repeat processing block 423. Otherwise, processing logic has gone through every sub-circuit of $Spec(N_1)$. Thus, processing logic may transition to processing block 430 to end the process by returning $N_2$ and the topological partition of $N_2$ represented by $Spec(N_2)$.

The importance of some embodiments of the SP procedure is twofold. First, the complexity of the SP procedure is the same as that of the CS verification procedure. Namely, it is exponential in the granularity p of the CS of $N_1$, $N_2$ represented by Spec($N_1$), Spec($N_2$) and linear in the number of sub-circuits in Spec($N_1$) and Spec($N_2$), assuming that the synthesis of $N_2^i$ is exponential in p. This means that if p is fixed, the SP procedure is linear in circuit size, and hence, the SP procedure is scalable.

Second, the SP procedure may allow one to make a trade-off between optimization quality and efficiency. Note that the search space explored by the SP procedure may be limited to the implementation of the specification of $N_1$ represented by Spec($N_1$). The smaller the granularity p of the specification S of $N_1$ is, the smaller the search space is and the greater the efficiency of the SP procedure is. So, if no good alternative implementation $N_2$ is found for the current specification of $N_1$, one can merge some adjacent sub-circuits of Spec($N_1$) to get a specification of larger granularity. With a specification of larger granularity, the search space may become larger at the expense of performance of the SP procedure.

Furthermore, even for a specification of small granularity, the space of implementations is very rich. The expression, ($2^p$)!, gives the number of different binary encodings of length p for a $2^p$-valued variable. Note that the value of ($2^p$)! is huge even for a very small p. This expression may provide a ballpark estimate of the number of functions that are toggle equivalent to a p-output Boolean function.

Note that in the examples described above, combinational circuits are used to illustrate the concepts of toggle equivalence and common specification, however, one should appreciate that these concepts can be applied to the synthesis of sequential circuits as well.

Figure 7:
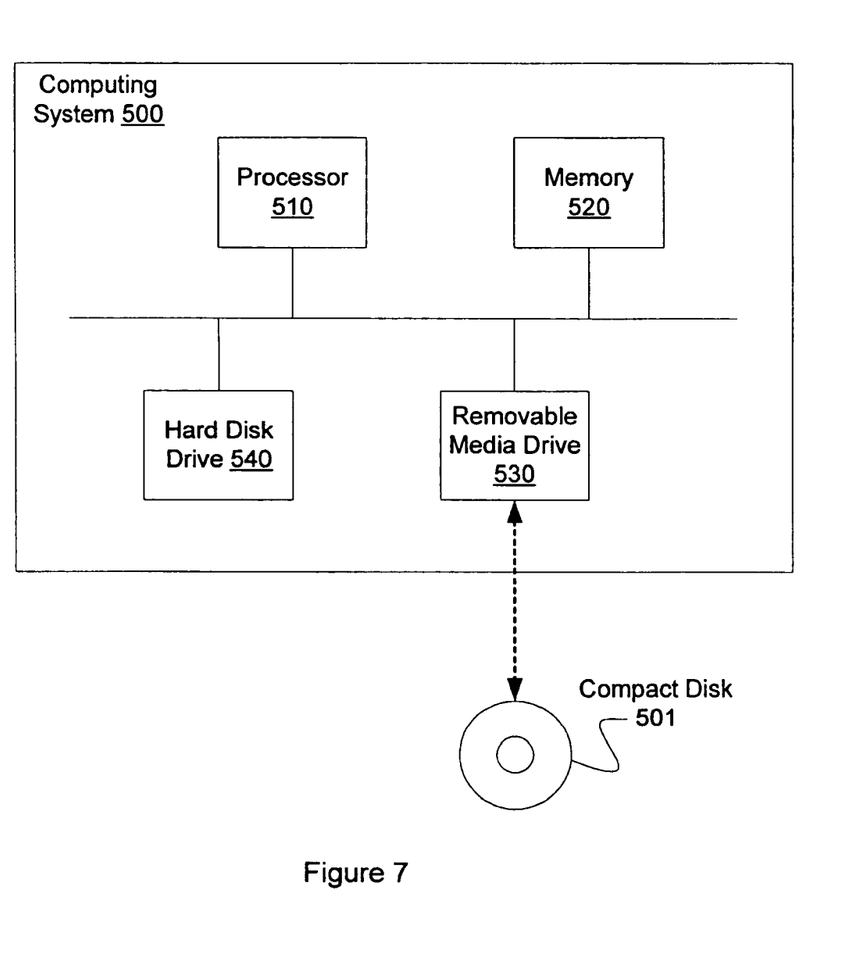
FIG. 7 illustrates an exemplary embodiment of a computing system usable with one embodiment of the present invention.

FIG. 7 illustrates a computing system that may be used to perform some or all of the processes according to some embodiments of the invention. In one embodiment, the computing system 500 includes a processor 510 and a memory 520, a removable media drive 530, and a hard disk drive 540. In one embodiment, the processor 510 executes instructions residing on a machine-readable medium, such as the hard disk drive 540, a movable medium (e.g., a compact disk 501, a magnetic tape, etc.), or a combination of both. The instructions may be loaded from the machine-readable medium into the memory 520, which may include Random Access Memory (RAM), dynamic RAM (DRAM), etc. The processor 510 may retrieve the instructions from the memory 520 and execute the instructions to perform operations described above.

Note that any or all of the components and the associated hardware illustrated in FIG. 7 may be used in various embodiments of the system 500. However, it should be appreciated that other configurations of the system 500 may include more or less devices than those shown in FIG. 7.

Figure 8:
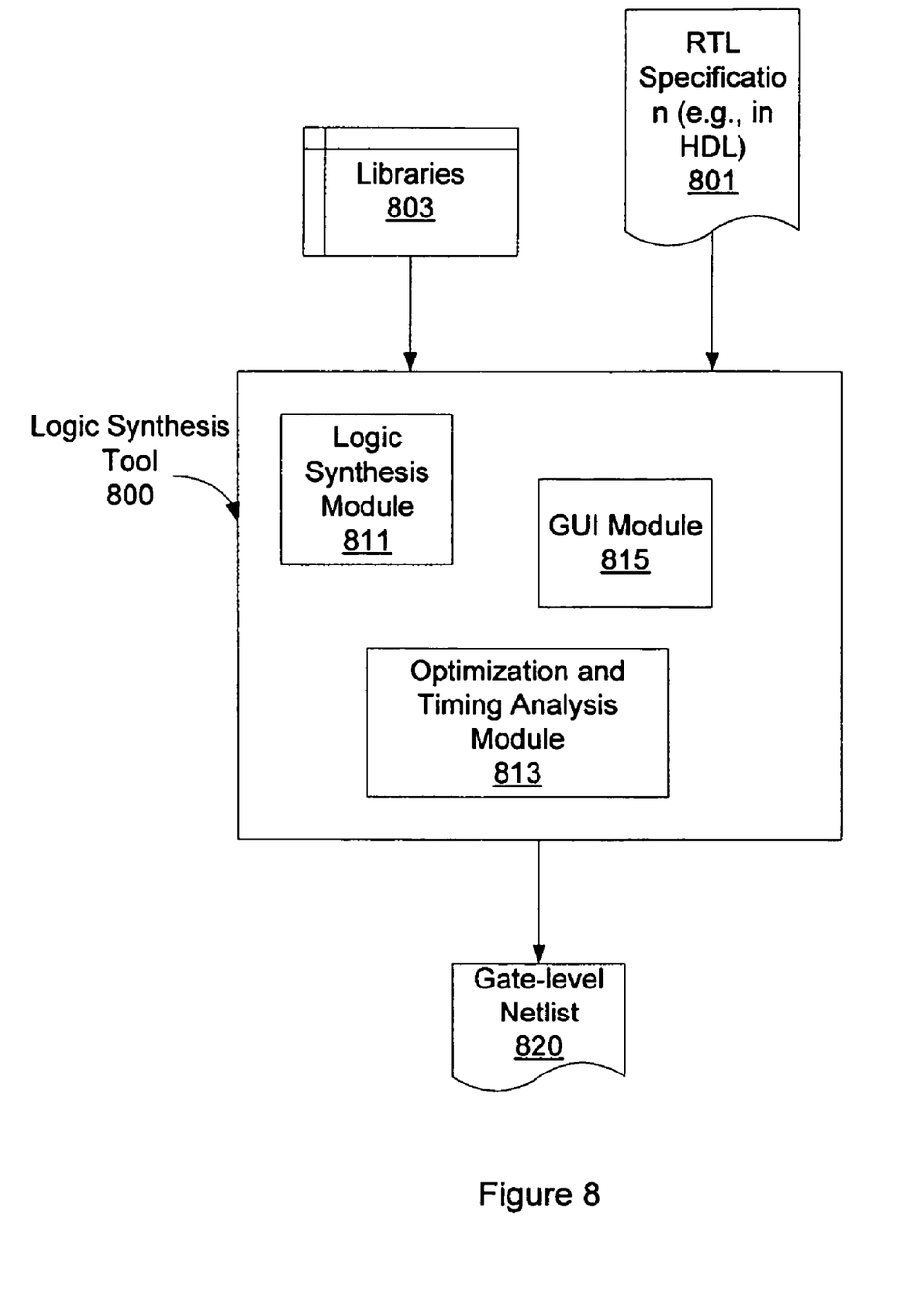
FIG. 8 illustrates an exemplary embodiment of a logic synthesis tool usable with one embodiment of the present invention.

FIG. 8 illustrates an exemplary embodiment of a logic synthesis tool usable with one embodiment of the present invention. The logic synthesis tool 800 includes several modules, which may be implemented using software, hardware, or a combination of both. The modules shown in FIG. 8 include a logic synthesis module 811, an optimization and timing analysis module 813, and a graphical user interface (GUI) module 815. Note that various embodiments of the logic synthesis tool may include more or fewer modules than those illustrated in FIG. 8. The logic synthesis tool 800 receives a high-level specification of a circuit design, such as the RTL specification 801, as an input. The RTL specification 801 may be written in a hardware description language (HDL), such as Verilog. In addition to the high-level specification, the logic synthesis tool 800 also receives data from a number of libraries 803, such as standard cell libraries, which describes the specific details of some circuit components (e.g., NAND gate, NOR gate, etc.) specific to a predetermined semiconductor fabrication process. The logic synthesis tool 800 outputs a gate-level netlist 820, which may contain description of the circuit components and the connection of the circuit components to implement the RTL specification 801.

In one embodiment, the logic synthesis module 811 performs logic synthesis on the RTL specification 801 to generate the gate-level netlist 820 based on the RTL specification 801 and the data from the libraries 803. The optimization and timing analysis module 813 may further optimize an intermediate gate-level netlist from the logic synthesis module 311 before the netlist 820 is output. In some embodiments, the optimization and timing analysis module 813 performs timing analysis as part of the process to optimize the intermediate gate-level netlist. The GUI module 815 may generate one or more graphical user interface to receive inputs (e.g., constraints, instructions, etc.) from users, where such inputs may be used to control or modify the operations performed by the logic synthesis module 811.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A method of circuit synthesis for integrated circuit design, the method comprising:
   building a first circuit $N_1$ partitioned into a first plurality of sub-circuits corresponding to a specification, wherein the specification specifies the partitioning of the first circuit $N_1$ into sub-circuits and the connectivity of the sub-circuits;
   deriving a plurality of toggle equivalent sub-circuits respectively corresponding to the first plurality of sub-circuits of the first circuit $N_1$; and
   building a second circuit $N_2$ using the plurality of toggle equivalent sub-circuits in response to the specification, wherein the plurality of toggle equivalent sub-circuits form a partitioning of the second circuit $N_2$ corresponding to the specification and the partitioning of the first circuit $N_1$ into sub-circuits.

2. The method of claim 1, wherein
   deriving the plurality of toggle equivalent sub-circuits comprises:
   for each of the first plurality of sub-circuits of the first circuit $N_1$:
      building a constraint function that relates one or more inputs of the corresponding sub-circuit to one or more inputs of the corresponding toggle equivalent sub-circuit of the second circuit $N_2$;
      synthesizing the next toggle equivalent sub-circuit of the second circuit $N_2$ based on the constraint function and a cost function; and
      computing a correlation function that relates outputs of the corresponding sub-circuit of the first circuit $N_1$ and outputs of the toggle equivalent sub-circuit of the second circuit $N_2$.

3. The method of claim 2, wherein
   the correlation function is computed in response to the constraint function.

4. The method of claim 1, wherein
   complexity of the deriving of the plurality of toggle equivalent sub-circuits and building the second circuit $N_2$ is linear in a number of the first plurality of sub-circuits of the first circuit $N_1$.

5. A method to implicitly reencode a multi-valued variable Y representing an output of a multi-valued function F of Boolean variables implemented by a Boolean circuit $N_1$, the method comprising:
   receiving a description of the first circuit $N_1$ including a specification of the partitioning of the first circuit into sub-circuits;
   replacing the first circuit $N_1$ with a second circuit $N_2$ corresponding to the specification and the partitioning of the first circuit $N_1$, wherein the second circuit $N_2$ implements the multi-valued function F; and
   synthesizing the second circuit $N_2$, wherein sub-circuits of the second circuit $N_2$ are respectively toggle equivalent sub-circuits to the sub-circuits of the first circuit $N_1$.

6. The method of claim 5, further comprising:
   verifying that the second circuit $N_2$ is toggle equivalent to the first circuit $N_1$.

7. A method to implicitly reencode a multi-valued variable Y representing an output of a multi-valued function F of Boolean variables implemented by a Boolean circuit $N_1$, the method comprising:
   receiving a description of the first circuit $N_1$;
   replacing the first circuit $N_1$ with a second circuit $N_2$, wherein the second circuit $N_2$ implements the multi-valued function F
   synthesizing the second circuit $N_2$, wherein the second circuit $N_2$ is toggle equivalent to the first circuit $N_1$;
   verifying that the second circuit $N_2$ is toggle equivalent to the first circuit $N_1$ including
      computing a constraint function ($D_{inp}$) that relates inputs of the first circuit $N_1$ and the second circuit $N_2$.

8. The method of claim 7, wherein verifying that the second circuit $N_2$ is toggle equivalent to the first circuit $N_1$ further comprises:
   computing a function ($D_{out}$) that relates outputs of the first circuit $N_1$ and the second circuit $N_2$.

9. The method of claim 8, wherein verifying that the second circuit $N_2$ is toggle equivalent to the first circuit $N_1$ further comprises:
   checking whether the function $D_{out}$ is a correlation function.

10. A machine-readable medium that provides instructions that, when executed, will perform operations for integrated circuit design, the operaitons comprise:
    building a first circuit $N_1$ partitioned into a first plurality of sub-circuits corresponding to a specification, wherein the specification specifies the partitioning of the first circuit $N_1$ into sub-circuits and the connectivity of the sub-circuits;
    deriving a plurality of toggle equivalent sub-circuits respectively corresponding to the first plurality of sub-circuits of the first circuit $N_1$; and
    building a second circuit $N_2$ using the plurality of toggle equivalent sub-circuits in response to the specification, wherein the plurality of toggle equivalent sub-circuits form a partitioning of the second circuit $N_2$ corresponding to the specification and the partitioning of the first circuit $N_1$ into sub-circuits.

11. The machine-readable medium of claim 10, wherein
    deriving the plurality of toggle equivalent sub-circuits comprises:
    for each of the first plurality of sub-circuits of the first circuit $N_1$:
       building a constraint function that relates one or more inputs of the corresponding sub-circuit to one or more inputs of the corresponding toggle equivalent sub-circuit of the second circuit $N_2$;

synthesizing the next toggle equivalent sub-circuit of the second circuit $N_2$ based on the constraint function and a cost function; and computing a correlation function that relates outputs of the corresponding sub-circuit of the first circuit $N_1$ and outputs of the toggle equivalent sub-circuit of the second circuit $N_2$.

12. The machine-readable medium of claim 11, wherein the correlation function is computed in response to the constraint function.

13. The machine-readable medium of claim 10, wherein complexity of the deriving of the plurality of toggle equivalent sub-circuits and building the second circuit $N_2$ is linear in a number of the first plurality of sub-circuits of the first circuit $N_1$.

14. A machine-readable medium that provides instructions that, when executed, will perform operations to implicitly reencode a multi-valued variable Y representing an output of a multi-valued function F of Boolean variables implemented by a first Boolean circuit $N_1$, the operations comprise:

receiving a description of the first circuit $N_1$; and replacing the first circuit $N_1$ with a second circuit $N_2$ corresponding to the specification and the partitioning of the first circuit $N_1$, wherein the second circuit $N_2$ implements the multi-valued function F; and synthesizing the second circuit $N_2$, wherein sub-circuits of the second circuit $N_2$ are respectively toggle equivalent sub-circuits to the sub-circuits of the first circuit $N_1$.

15. The machine-readable medium of claim 14, wherein the operations further comprise:

verifying that the second circuit $N_2$ is toggle equivalent to the first circuit $N_1$.

16. A machine-readable medium that provides instructions that, when executed, will perform operations to implicitly reencode a multi-valued variable Y representing an output of a multi-valued function F of Boolean variables implemented by a first Boolean circuit $N_1$, the operations comprise:

receiving a description of the first circuit $N_1$;

replacing the first circuit $N_1$ with a second circuit $N_2$, wherein the second circuit $N_2$ implements the multi-valued function F;

synthesizing the $N_2$, where the second circuit $N_2$ is toggle equivalent to the first circuit $N_1$; and verifying that the second circuit $N_2$ is toggle equivalent to the first circuit $N_1$ including computing a constraint function ($D_{inp}$) that relates inputs of the first circuit $N_1$ and the second circuit $N_2$.

17. The machine-readable medium of claim 16, wherein verifying that the second circuit $N_2$ is toggle equivalent to the first circuit $N_1$ further comprises:

computing a function ($D_{out}$) that relates outputs of the first circuit $N_1$ and the second circuit $N_2$.

18. The machine-readable medium of claim 17, wherein verifying that the second circuit $N_2$ is toggle equivalent to the first circuit $N_1$ further comprises:

checking whether the function $D_{out}$ is a correlation function.

19. A system comprising:

a machine-readable medium to store instructions; and a processor, coupled to the machine-readable medium, to retrieve instructions from the machine-readable medium and, in response to the instructions retrieved, to perform operations for integrated circuit design, the operations comprising:

building a first circuit ($N_1$) partitioned into a first plurality of sub-circuits corresponding to a specification, wherein the specification specifies the partitioning of the first circuit $N_1$ into sub-circuits and the connectivity of the sub-circuits;

deriving a plurality of toggle equivalent sub-circuits respectively corresponding to the first plurality of sub-circuits of the first circuit $N_1$; and building a second circuit $N_2$ using the plurality of toggle equivalent sub-circuits in response to the specification, wherein the plurality of toggle equivalent sub-circuits form a partitioning of the second circuit $N_2$ corresponding to the specification and the partitioning of the first circuit $N_1$ into sub-circuits.

20. The system of claim 19, wherein deriving the plurality of toggle equivalent sub-circuits comprises:

for each of the first plurality of sub-circuits of the first circuit $N_1$;

building a constraint function that relates one or more inputs of the corresponding sub-circuit to one or more inputs of the corresponding toggle equivalent sub-circuit of the second circuit $N_2$;

synthesizing the next toggle equivalent sub-circuit of the second circuit $N_2$ based on the constraint function and a cost function; and computing a correlation function that relates outputs of the corresponding sub-circuit of the first circuit $N_1$ and outputs of the toggle equivalent sub-circuit of the second circuit $N_2$.

21. The system of claim 20, wherein the correlation function is computed in response to the constraint function.

22. The system of claim 19, wherein complexity of the deriving of the plurality of toggle equivalent sub-circuit and building the second circuit $N_2$ is linear in a number of the first plurality of sub-circuits of the first circuit $N_1$.

23. A system comprising:

a machine-readable medium to store instructions; and a processor, coupled to the machine-readable medium, to retrieve instructions from the machine-readable medium and, in response to the instructions retrieved, to perform operations to implicitly reencode a multi-valued variable Y representing an output of a multi-valued function F of Boolean variables implemented by a Boolean circuit $N_1$, the operations comprising:

receiving a description of the first circuit $N_1$ including a specification of the partitioning of the first circuit into sub-circuits;

replacing the first circuit $N_1$ with a second circuit $N_2$ corresponding to the specification and the partitioning of the first circuit $N_1$, wherein the second circuit $N_2$ implements the multi-valued function F; and synthesizing the second circuit $N_2$, wherein sub-circuits of the second circuit $N_2$ are respectively toggle equivalent sub-circuits to the sub-circuits of the first circuit $N_1$.

24. The system of claim 23, wherein the operations further comprise:

verifying that the second circuit $N_2$ is toggle equivalent to the first circuit $N_1$.

25. A system comprising:

a machine-readable medium to store instructions; and a processor, coupled to the machine-readable medium, to retrieve instructions from the machine-readable medium and, in response to the instructions retrieved, to perform operations to implicitly reencode a multi-valued variable Y representing an output of a multi-valued function F of Boolean variables implemented by a Boolean circuit $N_1$, the operations comprising:

receiving a description of the first circuit $N_1$;

replacing the first circuit $N_1$ with a second circuit $N_2$, wherein the second circuit $N_2$ implements the multi-valued function F;

synthesizing the second circuit $N_2$, where the second circuit $N_2$ is toggle equivalent to the first circuit $N_1$, and verifying that the second circuit $N_2$ is toggle equivalent to the first circuit $N_1$ including computing a constraint function ($D_{inp}$) that relates inputs of the first circuit $N_1$ and the second circuit $N_2$.

26. The system of claim 25, wherein verifying that the second circuit $N_2$ is toggle equivalent to the first circuit $N_1$ further comprises:

computing a function ($D_{out}$) that relates outputs of the first circuit $N_1$ and the second circuit $N_2$.

27. The system of claim 26, wherein verifying that the second circuit $N_2$ is toggle equivalent to the first circuit $N_1$ further comprises:

checking whether the function $D_{out}$ is a correlation function.

\* \* \* \* \*